(12) United States Patent
Cole et al.

(10) Patent No.: US 11,550,339 B2
(45) Date of Patent: Jan. 10, 2023

(54) TETHER FOR AN INSPECTION VEHICLE

(71) Applicant: HITACHI ENERGY SWITZERLAND AG, Baden (CH)

(72) Inventors: Gregory A. Cole, West Hartford, CT (US); William J. Eakins, Bloomfield, CT (US); Daniel T. Lasko, Bloomfield, CT (US); Harshang Shah, Bloomfield, CT (US); Thomas A. Fuhlbrigge, Ellington, CT (US); Luiz V. Cheim, St. Charles, MO (US); Poorvi Patel, Ballwin, MO (US); Biao Zhang, West Hartford, CT (US); Saumya Sharma, Hartford, CT (US); Andrew Salm, West Hartford, CT (US); Sangeun Choi, Simsbury, CT (US)

(73) Assignee: HITACHI ENERGY SWITZERLAND AG, Baden (CH)

(*) Notice: Subject to any disclaimer, the term of this patent is extended or adjusted under 35 U.S.C. 154(b) by 845 days.

(21) Appl. No.: 16/434,613

(22) Filed: Jun. 7, 2019

(65) Prior Publication Data

US 2020/0218285 A1    Jul. 9, 2020

Related U.S. Application Data

(63) Continuation of application No. PCT/IB2017/001620, filed on Dec. 7, 2017.
(Continued)

(51) Int. Cl.
*G05D 1/04* (2006.01)
*B63G 8/00* (2006.01)
(Continued)

(52) U.S. Cl.
CPC ............. *G05D 1/048* (2013.01); *B63B 21/66* (2013.01); *B63B 59/00* (2013.01); *B63G 8/001* (2013.01);
(Continued)

(58) Field of Classification Search
CPC ...... G05D 1/048; G05D 1/0094; B63B 21/66; B63B 59/00; B63B 2207/02;
(Continued)

(56) References Cited

U.S. PATENT DOCUMENTS 2,751,703 A * 6/1956 Kietz ................... A01K 73/025
367/106
5,357,893 A * 10/1994 Ruffa ...................... B63B 21/66
114/244
(Continued)

FOREIGN PATENT DOCUMENTS

JP    H0919884 A    1/1997
WO    2012145745 A1    10/2012

OTHER PUBLICATIONS

International Bureau of WIPO, International Preliminary Report on Patentability issued in corresponding Application No. PCT/IB2017/001620, dated Jun. 20, 2019, 9 pp.
(Continued)

*Primary Examiner* — Anthony D Wiest
(74) *Attorney, Agent, or Firm* — Sage Patent Group

(57) ABSTRACT

A tether control system for an inspection vehicle operable in a housing having a liquid medium is disclosed in the present application. The tether system includes a tether connected between the inspection vehicle and an electronic controller. A controllable buoyancy system associated with the tether is operable for moving the tether in a desired location. The controllable buoyancy system includes one or more floating
(Continued)

bodies having a propulsion system and one or more buoyant elements having variable buoyancy capabilities.

28 Claims, 7 Drawing Sheets

Related U.S. Application Data

(60) Provisional application No. 62/431,321, filed on Dec. 7, 2016.

(51) Int. Cl.
*B63G 8/08* (2006.01)
*G05D 1/00* (2006.01)
*G01R 31/62* (2020.01)
*B63B 21/66* (2006.01)
*B63B 59/00* (2006.01)
*B63G 8/42* (2006.01)

(52) U.S. Cl.
CPC ............ *B63G 8/08* (2013.01); *B63G 8/42* (2013.01); *G01R 31/62* (2020.01); *G05D 1/0094* (2013.01); *B63B 2207/02* (2013.01); *B63B 2207/04* (2013.01); *B63G 2008/007* (2013.01)

(58) Field of Classification Search
CPC ...... B63B 2207/04; B63G 8/001; B63G 8/08; B63G 8/42; B63G 2008/007; G01R 31/62; Y02E 30/30; G21C 17/013; G02B 23/2492; H01F 27/12
See application file for complete search history.

(56) References Cited

U.S. PATENT DOCUMENTS 9,463,849 B2* 10/2016 McCabe ................ B63G 8/001
9,828,068 B2* 11/2017 Bowen ................... B63B 21/20

OTHER PUBLICATIONS

European Patent Office, International Search Report & Written Opinion issued in corresponding Application No. PCT/IB2017/001620, dated May 2, 2018, 14 pp.

* cited by examiner

TETHER FOR AN INSPECTION VEHICLE

TECHNICAL FIELD

The present application generally relates to an inspection vehicle for inspecting a liquid filled housing such as a transformer or the like and more particularly, but not exclusively to a tether having a controllable buoyancy system operably coupled thereto.

BACKGROUND

An apparatus with a liquid-filled housing such as a power transformer or the like needs periodic inspection and maintenance. Liquid-filled housings are configured to hold electrically powered components and are often extremely heavy and difficult to transport and/or replace. In-situ inspection and maintenance can be a desirable alternative to replacement of such an apparatus. It is possible to drain the liquid from the housing prior to inspecting and repairing internal components, however this is a time consuming and expensive process. An inspection vehicle operable in a liquid medium with a tether connection may be used, however the tether may become tangled or interfere with internal components under some conditions. Some existing systems have various shortcomings relative to certain applications. Accordingly, there remains a need for further contributions in this area of technology.

SUMMARY

One embodiment of the present application is a tethered vehicle for inspecting a liquid filled housing such as a transformer or the like. Other embodiments include apparatuses, systems, devices, hardware, methods, and combinations for a tether having a controllable buoyancy and propulsion system. Further embodiments, forms, features, aspects, benefits, and advantages of the present application shall become apparent from the description and figures provided herewith.

DETAILED DESCRIPTION OF THE ILLUSTRATIVE EMBODIMENTS

Figure 1:
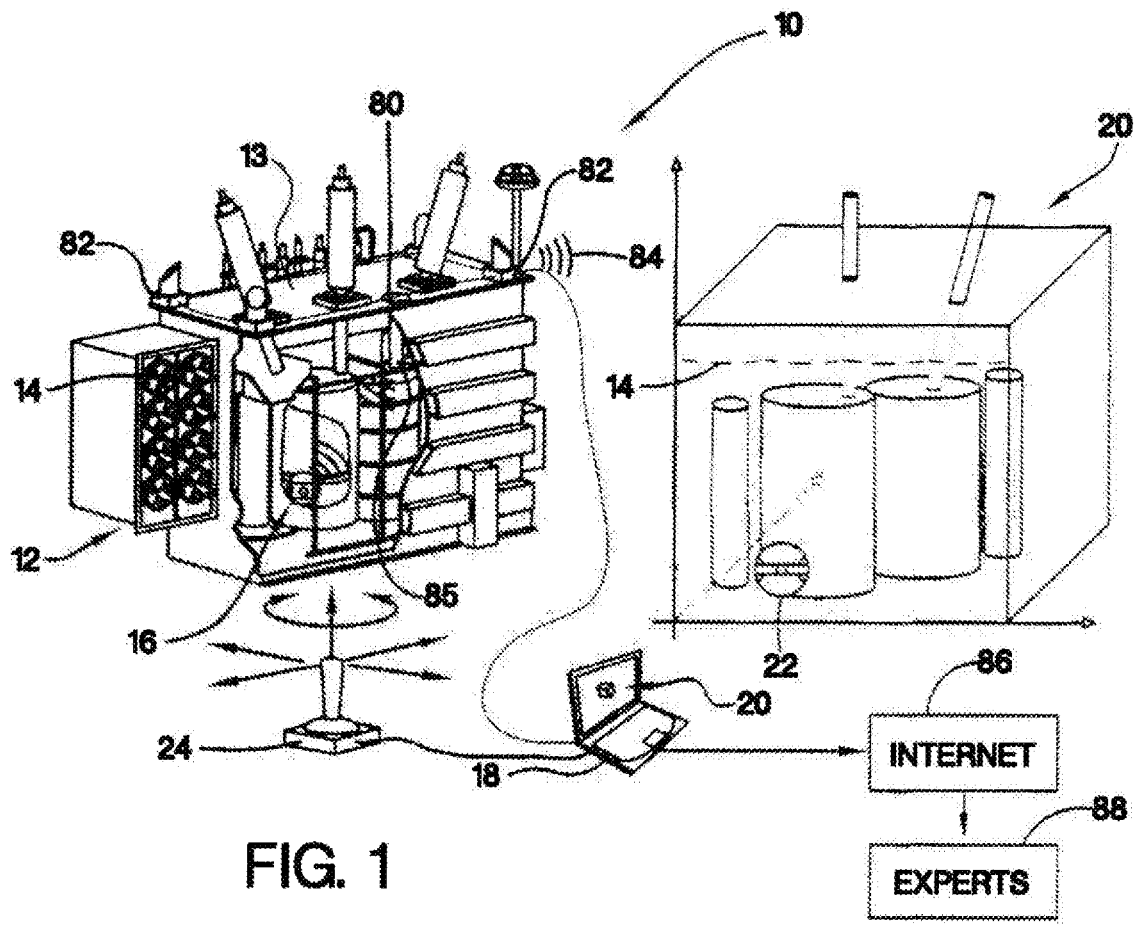
FIG. 1 is a schematic diagram of a system for in-situ inspection according to one exemplary embodiment of the present disclosure.

For the purposes of promoting an understanding of the principles of the application, reference will now be made to the embodiments illustrated in the drawings and specific language will be used to describe the same. It will nevertheless be understood that no limitation of the scope of the application is thereby intended. Any alterations and further modifications in the described embodiments, and any further applications of the principles of the application as described herein are contemplated as would normally occur to one skilled in the art to which the application relates.

Referring to FIG. 1, a system for in-situ inspection of a liquid filled transformer designated generally by the numeral 10 is illustrated. It should be understood that while liquid filled electrical transformers are described and referenced in this application, the systems and methods described herein are not limited to liquid filled transformers, but on the contrary can be used with any liquid filled housing or container wherein physical inspection, data collection, data transmittal and repair procedures or the Ike are desired without prior draining of the liquid from the housing. By way of example, and not limitation, in-situ inspection may be performed in/on portions of ship hulls, electrical interrupters, high voltage switch gears, nuclear reactors, fuel tanks, food processing equipment, floating roof storage system, chemical storage tank, or other apparatuses of similar nature.

In one exemplary embodiment, the system 10 can be used for inspection, data transmittal and/or maintenance of a transformer 12. The transformer 12 contains high-voltage electrical components immersed in a cooling fluid 14 such as oil. Skilled artisans will appreciate that the inspection typically occurs when the transformer 12 is offline or not in use. The transformer 12 utilizes the cooling fluid 14 to maintain temperature and disburse heat generated by the internal components during operation of the transformer 12. In some embodiments, the cooling fluid 14 can include dielectric properties such that electrical conduction is reduced or entirely eliminated in the fluid 14. The transformer 12 can be maintained in a sealed configuration so as to prevent contaminants or other foreign matter from entering therein. As used herein, a "sealed configuration" of the tank or housing 13 allows for conduit ducts or other hardware associated with the transformer 12 to extend through a wall via a sealed joint formed with the housing 13 to allow for connection to electrical components and/or monitoring devices maintained in the housing 13. The housing 13 includes at least one opening to allow for ingress into and egress out of the housing 13. An inspection vehicle 16 sometimes referred to as a "robot," is insertable into the housing 13 of the transformer 12 and is controlled either by un-tethered wireless remote control or through a tether connection. In some embodiments an inspection vehicle or a separable portion thereof may be submersible without having self-propelled motion capability.

A computational device 18, such as a laptop computer or other appropriate computing device can communicate with the inspection vehicle 16 either by direct connection through a tether or wirelessly. The computer 18 may maintain a virtual transformer image 20 of the internal construction of the transformer 12. In some embodiments, this virtual image can be a computer-aided-design (CAD) image generated in construction or design of the transformer 12. However, in other forms, images such as photographs or actual real time video generated by sensors and cameras associated with the inspection vehicle 16 may be utilized. As will be described in further detail, the computer 18 may utilize the virtual transformer image 20 in conjunction with a virtual inspection vehicle 22, to represent the actual inspection vehicle 16, so as to monitor the positioning of the inspection vehicle 16 within the transformer 12. A motion control input device, such as a joystick 24 can be connected to the computer 18 and/or directly to the inspection vehicle 16 to allow an operator to control movement of the inspection vehicle 16 inside the transformer 12. Control of the inspection vehicle 16 can be aided by observations of the virtual inspection vehicle 22 as it moves about the virtual transformer image 20. In other words, an operator can control movement of the inspection vehicle 16 based on the observed position of the inspection vehicle 16 within the transformer 12. Other types of motion control input devices, such as those used in video games, handheld computer tablets, computer touch screens or the like may be employed without deviating from the teachings herein. It should be understood that in some applications the operator may be located on-site or near the apparatus to be inspected. However, in other applications the operator may be located off-site and indeed anywhere in the world through communication via World Wide Web internet connection.

Figure 2:
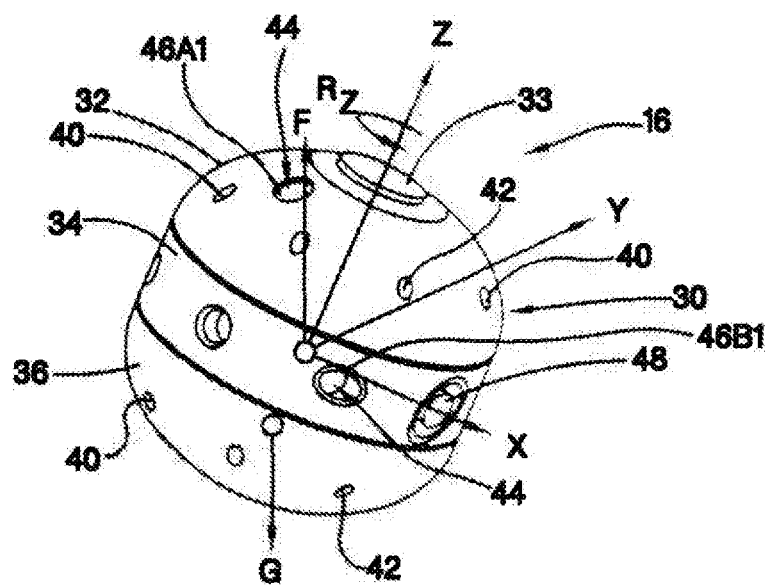
FIG. 2 is a perspective view of an inspection vehicle used within the system according to one exemplary embodiment of the present disclosure.
Figure 3:
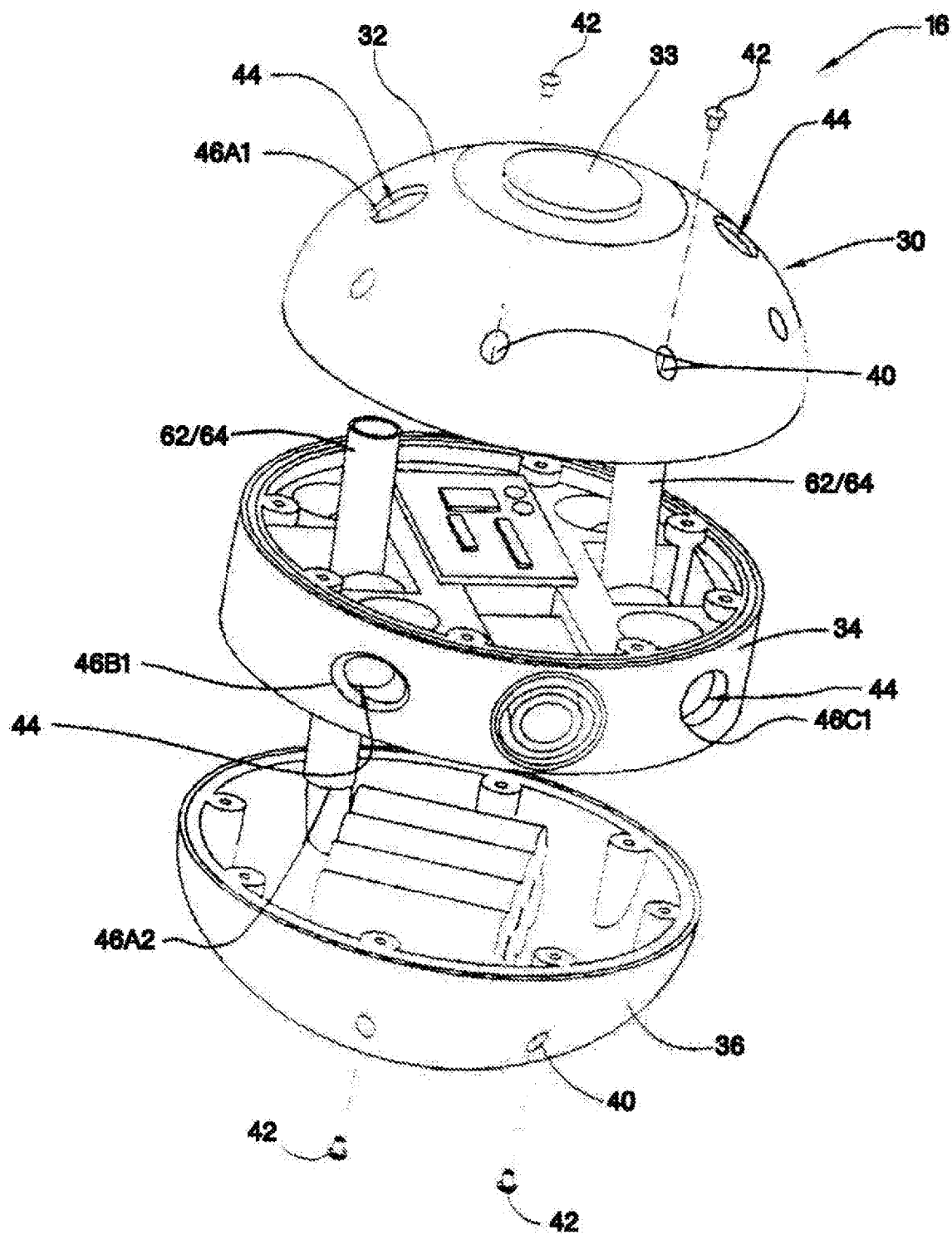
FIG. 3 is an exploded view of the inspection vehicle used within the system according to one exemplary embodiment of the present disclosure.
Figure 4:
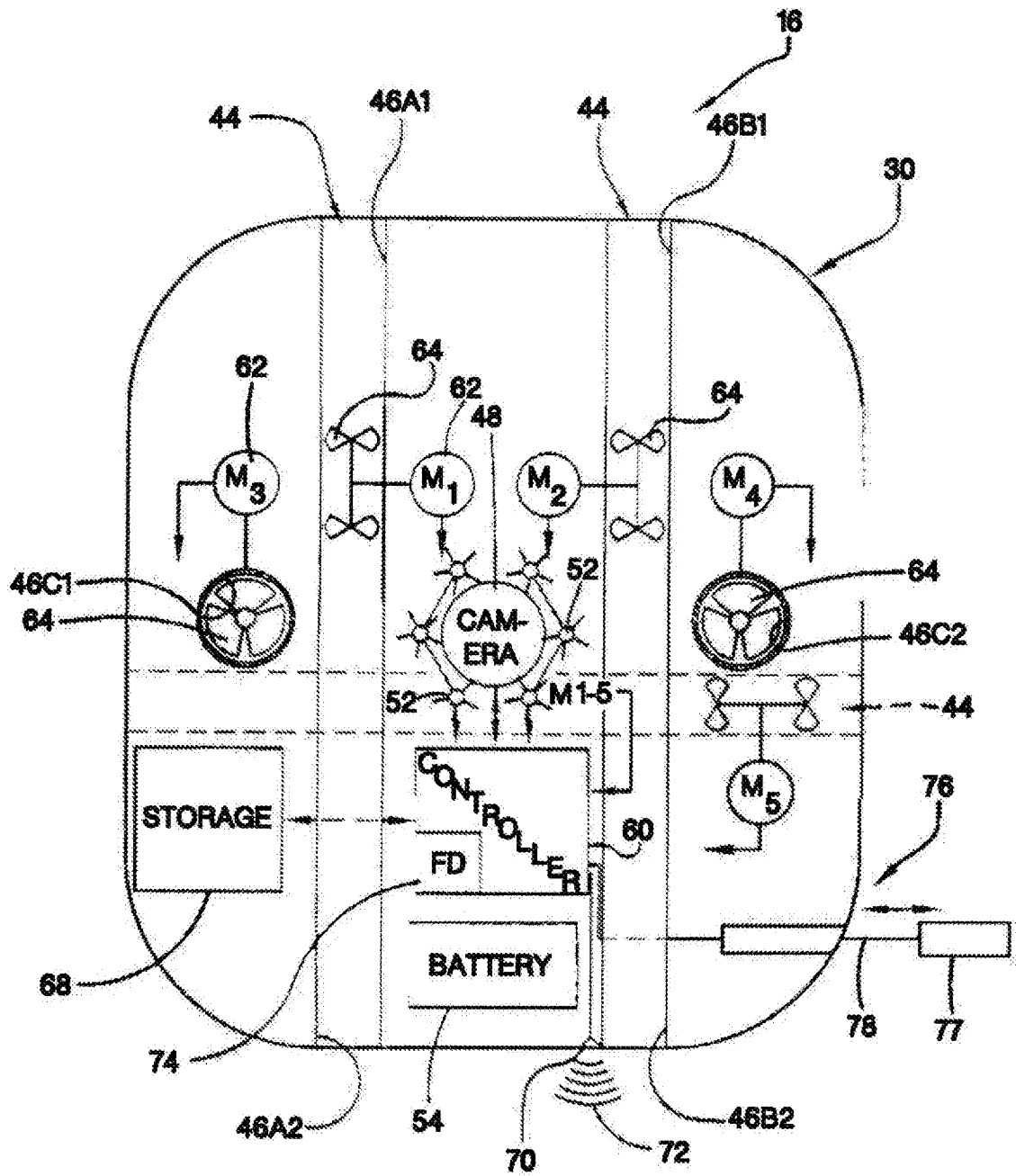
FIG. 4 is a schematic diagram of the inspection vehicle according to one exemplary embodiment of the present disclosure.

Referring now to FIGS. 2-4, the inspection vehicle 16 includes a vehicle housing 30 that is substantially cylindrical or spherical in construction with no significant protrusions or extensions that might otherwise be entangled with the internal components within the transformer 12. The vehicle housing 30 of the inspection vehicle 16 includes an upper cover 32 having a minimally extending nub 33, a middle section 34 and a lower cover 36. The nub 33 is sized so as to allow for grasping of the inspection vehicle 16 from within the transformer 12 by a tool or by an operator's hand. The nub 33 could have other shapes, such as a loop, to facilitate easy grasping, depending on the type of tool used to grasp the inspection vehicle 16. The cover 32, the middle section 34 and the cover 36 can be secured to one another with fastener apertures 40 that extend through at least the covers 32 and 36 so as to receive fasteners 42 to allow for attachment to the middle section 34. In most embodiments the fasteners 42 are maintained flush with the surface of the cover so as to minimize drag and prevent entanglement with internal components of the transformer 12. Other forms of mechanical fastening may be used, such as threaded engagement, press-fit, or mechanical clip or the like. Further, in some embodiments, the inspection vehicle 16 may only include two sections and in other embodiments the inspection vehicle 16 may include four or more sections.

Extending through the vehicle housing 30 are at least two pump flow channels designated generally by the numeral 44. These channels extend vertically and horizontally through the vehicle housing 30 and are configured so as to be sealed from the internal components of the vehicle housing 30. Each flow channel 44 provides a pair of ports 46. As shown in the drawings, numeric and alphabetic designations are provided so as to identify particular ports. For example, port 46A1 is at one end or side of the vehicle housing 30 while the opposite end of the flow channel 44 is designated by port 46A2. As such, the fluid maintained within the transformer can flow from one port 46A1 through and exit out port 46A2. In a similar manner, the oil may flow through port 46B1 and out through port 46B2. As will be discussed, components maintained within the channels move the fluid in either direction, through the inspection vehicle 16 and thus allow the inspection vehicle 16 to move within the transformer 12. It should be appreciated that alternate flow channel configurations could be implemented. For example, fluid could enter the inspection vehicle 16 through a single inlet and internal valves could route the fluid to all outlet ports. In another example, the vertical path could have one inlet port and two or more outlet ports. At least one sensor 48 is carried by the vehicle housing 30 and in some embodiments the sensor 48 is a camera. Other sensors can be used in some embodiments such as, by way of non-limiting examples, proximity sensors, acoustic sensors, electromagnetic sensors, voltage sensors, amperage sensors, pressure sensors and temperature sensors. The camera 48 is configured to receive and transmit images through a plurality of wavelength images of the internal components of the transformer 12. The wavelengths can include visible, infrared, or others as desired. These images allow an operator to monitor and inspect various components within the transformer 12.

In some embodiments, the vehicle housing 30 can include one or more light sources 52 which facilitate illumination of the area surrounding the inspection vehicle 16. In some embodiments the lights 52 can be light emitting diodes, but it will be appreciated that other illumination devices can be used. For example, one or more of the lights 52 can include ultraviolet (UV) frequencies that may be used to cure UV hardened adhesives or the like. The illumination devices are oriented so as to illuminate the viewing area of the camera 48. In some embodiments, the operator can control the intensity and wavelength of the light.

A battery pack 54 is maintained within the inspection vehicle 16 so as to power the internal components such as the sensor 48, the lights 52 and a controller 60. The controller 60 operates the sensor 48 and lights 52 and also controls operation of a motor 62 and a pump 64 which are used in combination with each of the provided pump flow channels 44. The controller 60 maintains the necessary hardware and software to control operation of the connected components and maintain the ability to communicate with the computer 18 as well as with other devices. The controller 60 provides functionality in addition to controlling the motion of the inspection vehicle 16. For example, the controller 60 can provide for a data recording function so that a high-resolution, high-speed video of the entire inspection area generated by the sensor 48 can be recorded and stored onboard by the storage device 68. On board storage may be used in instances where wireless streaming of the video is interrupted or the antenna transmission of the wireless signals has a lower than desired bandwidth. Skilled artisans will appreciate that the sensor 48 may also be a thermal camera, a sonar sensor, a radar sensor, a three-dimensional vision sensor, or any combination of sensors.

Each motor 62 is reversible so as to control the flow of fluid through the flow channels by the pump 64. In other words, each motor is operated independently of one another so as to control operation of the associated pump 64 such that rotation of the pump 64 in one direction causes the fluid to flow through the flow channel 44 in a specified direction and thus assist in propelling the vehicle housing 30 in a desired direction. The pump 64, which may also be referred to as a thruster pump, is shown as being a propeller type configuration, but other configurations such as a paddle-type pump or gear pump could be utilized.

In some embodiments, a single motor may be used to generate a flow of fluid through more than one channel. In other words, the vehicle housing 30 could provide a single inlet and two or more outlets. Valves maintained within the vehicle housing 30 could be used to control and re-direct the internal flow of the fluid and, as a result, control movement of the vehicle housing 30 within the transformer tank or housing 13. By coordinating operation of the motors with the controller, and thus the oil flowing through the vehicle housing 30, the inspection vehicle 16 can traverse all areas having sufficient space within the transformer 12. Moreover, the inspection vehicle 16 is able to maintain an orientational stability while maneuvering in the transformer tank or housing 13. In other words, the inspection vehicle 16 is stable such that it will not move end-over-end while moving within the transformer tank or housing 13. The vehicle housing 30 of the inspection vehicle 16 provides for a center of gravity designated by the capital letter G. The inspection vehicle 16 components are designed so that the center of gravity G is lower than the center of the buoyant force of the inspection vehicle 16 designated by the capital letter F. As skilled artisans will appreciate, this enables the inspection vehicle 16 to be provided with stability during traversal motion.

The vehicle housing 30 also carries a data storage device 68 which collects the data from the sensor 48 and is adequately sized to provide for storage of video or still images taken by a camera. The storage device 68 is connected to the controller 60 so as to provide for reliable transfer of the data from the sensor/camera 48 to the storage device 68. It will be appreciated that in some embodiments the storage device 68 is connected directly to the sensor 48 and the controller receives the data directly from the storage device 68. An antenna 70 is connected to the controller 60 for the purpose of transmitting data collected from the sensor 48 and also for sending and receiving control signals for controlling the motion and/or direction of the inspection vehicle 16 within the transformer 12. The antenna generates a wireless signal 72 that can be detected by the computer 18 or any intermediate device. A failure detection module 74 (designated as FD in FIG. 4) may be included in the controller 60 so as to shut down the internal components within the inspection vehicle 16 if a system failure is detected. For example, if a low battery level is detected by the controller 60, the module 74 and the controller 60 can begin a controlled shutdown of the inspection vehicle 16 which would cause the inspection vehicle 16 to float to the surface due to its positive buoyancy. In another example, a loss of connection to the remote system could also trigger a shutdown.

After floating to the surface, the vehicle housing 30 can be grasped by the nub 33. A borescope 76 may also be carried by the vehicle housing 30. One end of the borescope provides a camera 77 or other sensor connected to a retractable fiber-optic cable 78 which is connected at its opposite end to the controller 60. When in a retracted position the camera 77 is flush with the surface of the vehicle housing 30 so as to prevent entanglement with the components inside the transformer 12. When inspection of hard to view items is needed, such as the windings of the transformer 12, the cable 78 is extended while the inspection vehicle 16 is maintained in a stationary position. After images and other data are collected by the camera 77, the cable 78 is retracted. As a result, the borescope 76 allows further detailed inspection of the transformer 12.

As noted previously, the inspection vehicle 16 is configured so as to easily move around the obstacles within the transformer 12. The vehicle housing 30 is a cylindrical-shaped with sphere ends or sphere shaped configuration and is provided with a buoyant design so as to allow the inspection vehicle 16 to float to the top of the oil when it is powered off purposefully or accidentally. The inspection vehicle 16 is configured so as to allow for the thruster pumps 64 to move the inspection vehicle 16 around by selective actuation of each pump. As a result, the inspection vehicle 16 has four degrees of freedom or motion: X, Y, Z and rotation around Z. As a result, by controlling the direction of the pump thrusters 64, the inspection vehicle 16 can be easily moved.

Referring back to FIG. 1, it can be seen that the transformer 12 has at least one transformer hole 80. In general operation, the oil is inserted through any number of holes located in the top of the tank. Holes 80 may also be provided at the bottom of the tank to allow for the fluid to be drained. The holes 80 are provided with the appropriate plugs or caps. Accordingly, it will be appreciated that the size of the inspection vehicle 16 must be such that it can fit within the hole 80.

The transformer 12 may be configured with a plurality of transmit signal receivers 82 mounted on the upper corners, edges or other areas of the transformer 12, or in nearby proximity to the transformer 12. The transmit signal receivers 82 receive the wireless signal 72 from the inspection vehicle 16 to determine the position of the inspection vehicle 16 in the transformer tank or housing 13. The receivers 82 use triangulation, based on the signals 72 received or other methodology, to determine a position of the inspection vehicle 16 in the transformer tank or housing 13. This position information is then transmitted by a signal 84, either wired or wirelessly, to the computer 18. Additionally, the information collected by the sensor 48, such as visual data, is transferred to the computer or other visual receiving device separately. In other words, the informational data generated by the sensor 48 is transmitted to the computer 18 through the fluid and the tank wall with the openings 80. Use of these different communication paths may be used to prevent interference between the signals; however, some embodiments may utilize the same communication path to transfer data related to positioning, data information, and control information as appropriate. Reliable communication for the motion control of the inspection vehicle 16 and data/video streaming are required for the transformer 12 in-situ inspection. Utilizing the dielectric feature of the transformer coolant oil, the inspection vehicle 16 can be controlled by radio frequencies rather effectively. The video streaming for a Wi-Fi camera (e.g. 4.2 GHz) has been proven to be sufficient. To ensure reliable communication between the inspection vehicle 16 and the computer 18, a transceiver 85 may be inserted into the cooling oil tank through the service opening on the top of the transformer 12.

In most embodiments, the transceiver 85 is used to exchange data information from the sensor 48 and the camera 77, via the controller 60 to the computer 18; and motion control or maneuvering signals from the joystick 24 via the computer 18 to the controller 60 so as to operate the motors 62 and thrusters 64. The signal 84, transmitted by the receiver 82 is used by the computer 18 to provide a separate confirmation of the position of the inspection vehicle 16 within the transformer tank or housing 13.

The computer 18 receives the position signals 84 and information signals 72 and in conjunction with the virtual image 20 correlates the received signals to the virtual image so as to allow an operator to monitor and control movement of the inspection vehicle 16. This allows the operator to inspect the internal components of the transformer 12 and pay particular attention to certain areas within the transformer 12 if needed. By utilizing a virtual image of the internal features of the transformer 12 and the position of the inspection vehicle 16 with respect to those virtual features, the image obtained can be matched with the corresponding site inside the actual transformer tank or housing 13. Based on the visual representation of the transformer image 20 and the virtual inspection vehicle 22 in relation to the image, an operator can manipulate the joystick 24 response. The computer 18 receives the movement signals from the joystick 24 and transmits those wirelessly to the antenna 72, whereupon the controller 60 implements internally maintained subroutines to control the pump thrusters 64 to generate the desired movement. This movement is monitored in real-time by the operator who can re-adjust the position of the inspection vehicle 16 as appropriate.

In some embodiments the computer 18 can be connected to a network 86, such as the internet, so as to allow for the images or sensor data to be transferred to experts, who may be remotely located, designated by the block 88 so that their input can be provided to the operator so as to determine the nature and extent of the condition within the transformer 12 and then provide corrective action as needed. In some embodiments, control of the inspection vehicle 16 can also be transferred to an expert, who may be remotely located. In such embodiments, the expert would have another computer that can send control signals via a network to the local computer 18 that in turn sends signals to control the inspection vehicle 16 as described above.

Figure 5:
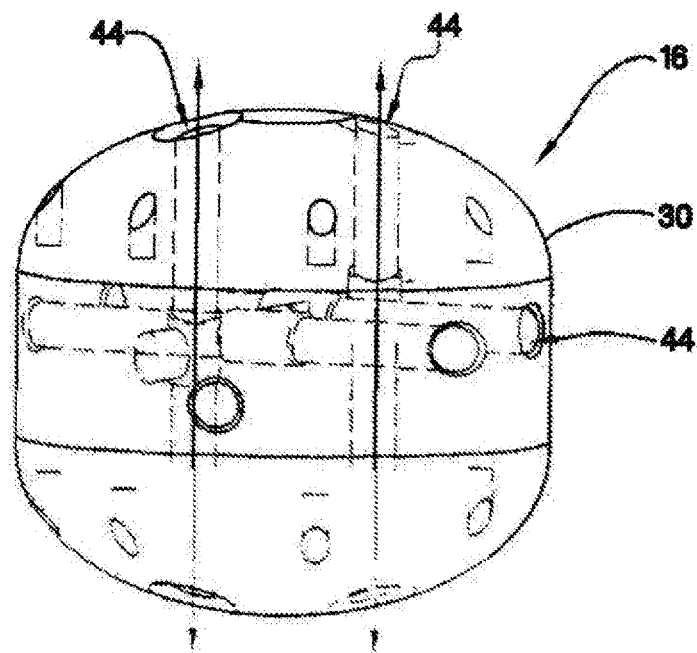
FIG. 5 is a schematic diagram of the inspection vehicle according to one exemplary embodiment of the present disclosure where two pumps under one control move the device in the Z direction.

Referring now to FIGS. 5-9, it can be seen that control of the motors and pump thrusters and their direction of fluid flow through the channels can control the motion of the inspection vehicle 16 within a fluid. For example, FIG. 5 shows the utilization of two pumps under one control so as to move the inspection vehicle 16 in a Z direction (see FIG. 2). To drive along the Z axis and to remain a stable depth, the Z axis thrusters have to run continuously. The Z thruster action can be controlled either manually by the operator or automatically by the controller. As used herein, the terminology "one control" refers to operating two pumps to operate in conjunction with one another so that the fluid flow is uniformly in one direction or the other.

Figure 6:
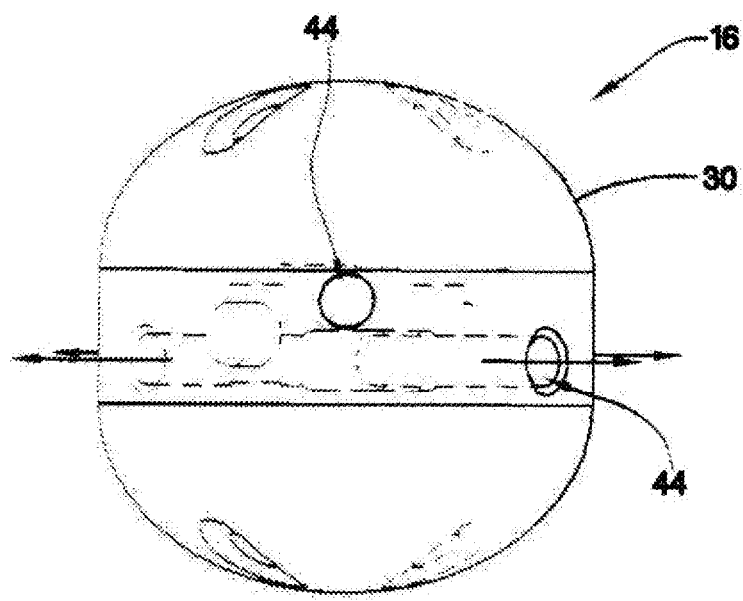
FIG. 6 is a schematic diagram of the inspection vehicle according to one exemplary embodiment of the present disclosure where two pumps under two controls move the device in the X direction.
Figure 7:
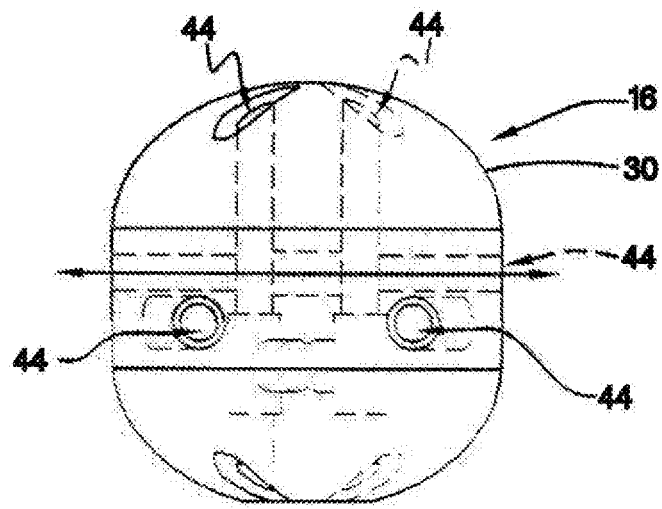
FIG. 7 is a schematic diagram of the inspection vehicle according to one exemplary embodiment of the present disclosure where a single pump under one control moves the device in the Y direction.

In FIG. 6 it can be seen that an X direction (see FIG. 2) can be obtained by utilizing two pumps under two controls so as to allow for movement in an X direction. As used herein, operation of "two pumps under two controls" means that the controller operates the pumps separately from one another. In FIG. 7 it can be seen that the inspection vehicle 16 is movable along the Y direction (see FIG. 2) wherein one pump is utilized under one control. It will be appreciated that FIG. 7 is a side view of FIG. 6 and at a slightly different elevation with respect to the X directional flow channels. As mentioned above, other embodiments could use different combinations of channels. For example, the three or four channels could exist in the Z direction. Also, other embodiments could have one inlet port and two outlet ports for a channel, or vice versa, or even use a different number of inlets and outlets. The number of pumps could also vary. For example, one pump could be used to control the flow of fluid from one inlet port which is then output through four outlet ports.

Figures 8A, 8B:
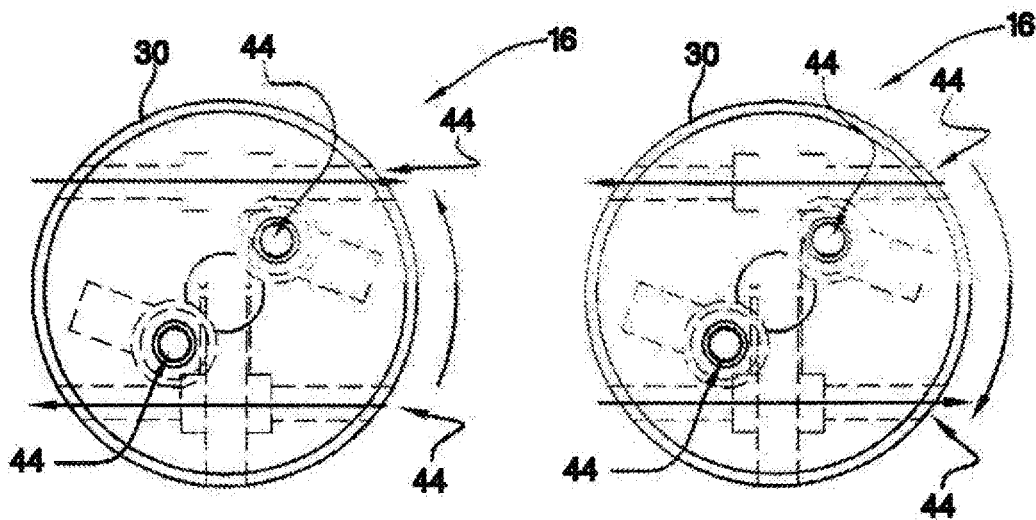
FIGS. 8A and 8B are schematic diagrams of the inspection vehicle according to one exemplary embodiment of the present disclosure wherein two pumps under one control operate to rotate the device in a counter-clockwise direction and in a clockwise direction, respectively.
Figure 9A:
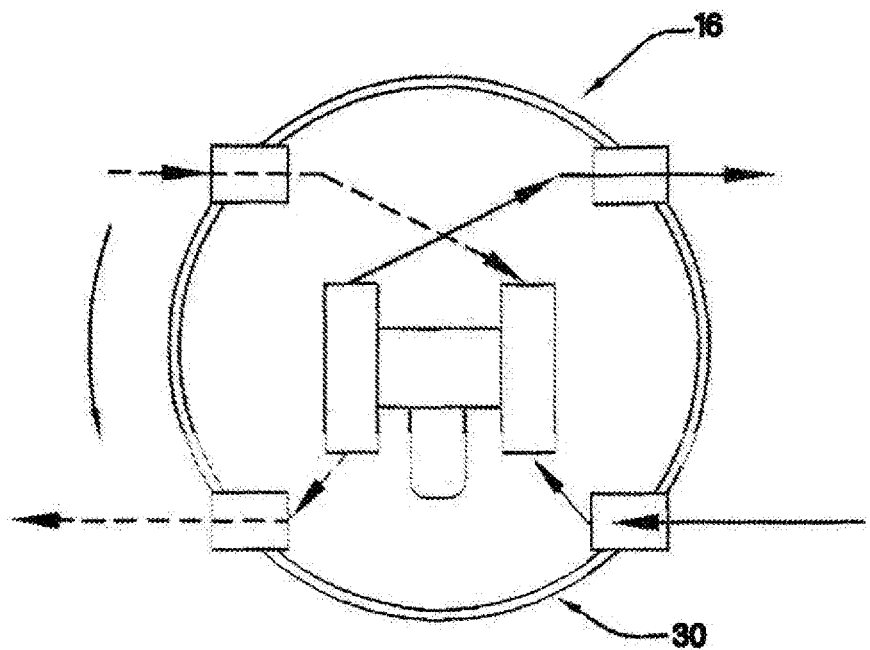
FIGS. 9A and 9B are schematic diagrams of the inspection vehicle according to one exemplary embodiment of the present disclosure wherein one pump operates to rotate the vehicle in a counter-clockwise direction and in a clockwise direction, respectively.
Figure 9B:
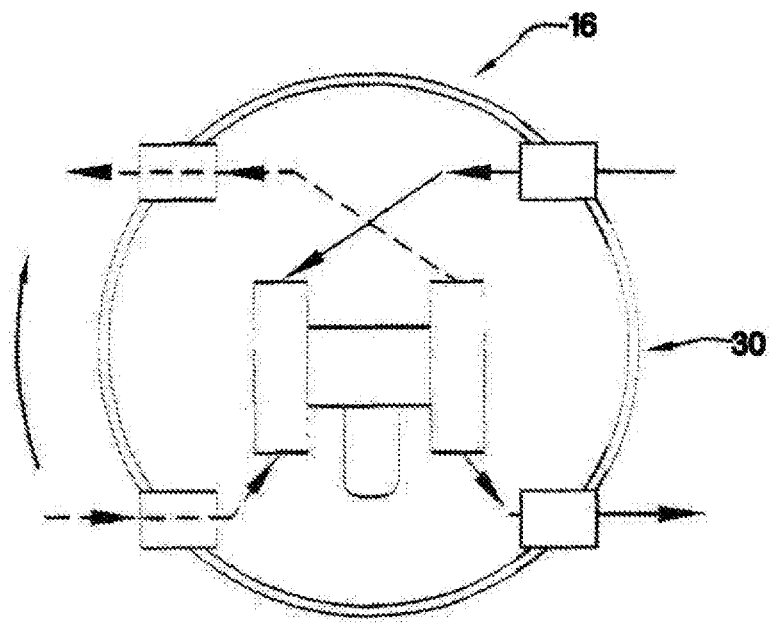

In FIGS. 8A and 8B it can be seen that two pumps under one control allow for rotation of the inspection vehicle 16. In FIG. 8A, by directing the fluid flow in one direction through one channel and an opposite direction in another channel, counter-clockwise rotation can be obtained. By reversing the flows in both channels, clockwise rotation can be obtained as seen in FIG. 8B. In another variation, FIGS. 9A and 9B show rotation of the inspection vehicle 16 utilizing one pump under one control wherein the flow is directed from one side of the inspection vehicle 16 into the inspection vehicle 16 and then back out the same side. A corresponding flow is provided by the opposite side of the inspection vehicle 16 so as to provide for rotation about the Z axis. Reversing the flow provides a corresponding reversal of the rotation of the inspection vehicle 16 along the Z axis.

The inspection vehicle 16 allows for visual and other inspection without draining the transformer oil. This is accomplished by being able to control the inspection vehicle 16 in the oil and perform visual or other inspection through the oil. The inspection vehicle 16 is constructed to be resistant to an oil environment and is properly sealed. Additionally, the inspection vehicle 16 is small enough to be put inside a transformer tank or housing 13 using existing service holes, e.g. those used for filling the transformer oil. As a result, it is not needed to unseal the transformer tank top completely. Another aspect is that the inspection vehicle 16 can be controlled from the outside of the transformer using a joystick 24 and computing device 18 which may also be used for displaying visual data from the sensor(s).

As internal regions of a transformer have no ambient light, the sensor 48 utilizes a supporting light source carried by the inspection vehicle 16. Various wavelengths of light may be used (visible and/or non-visible light) for detailed inspection of the transformer 12 components inside. A remotely controlled arm that guides a thin fiber-optic camera head inside the transformer 12 winding block may also be used. Still another aspect of the inspection vehicle 16 is that all materials employed in the construction of the inspection vehicle 16 are oil compatible. This is to avoid any type of contamination introduced by the inspection vehicle 16, so that the transformer 12 can directly return to operation after the inspection of inspection vehicle 16 without oil treatment.

Figure 10:
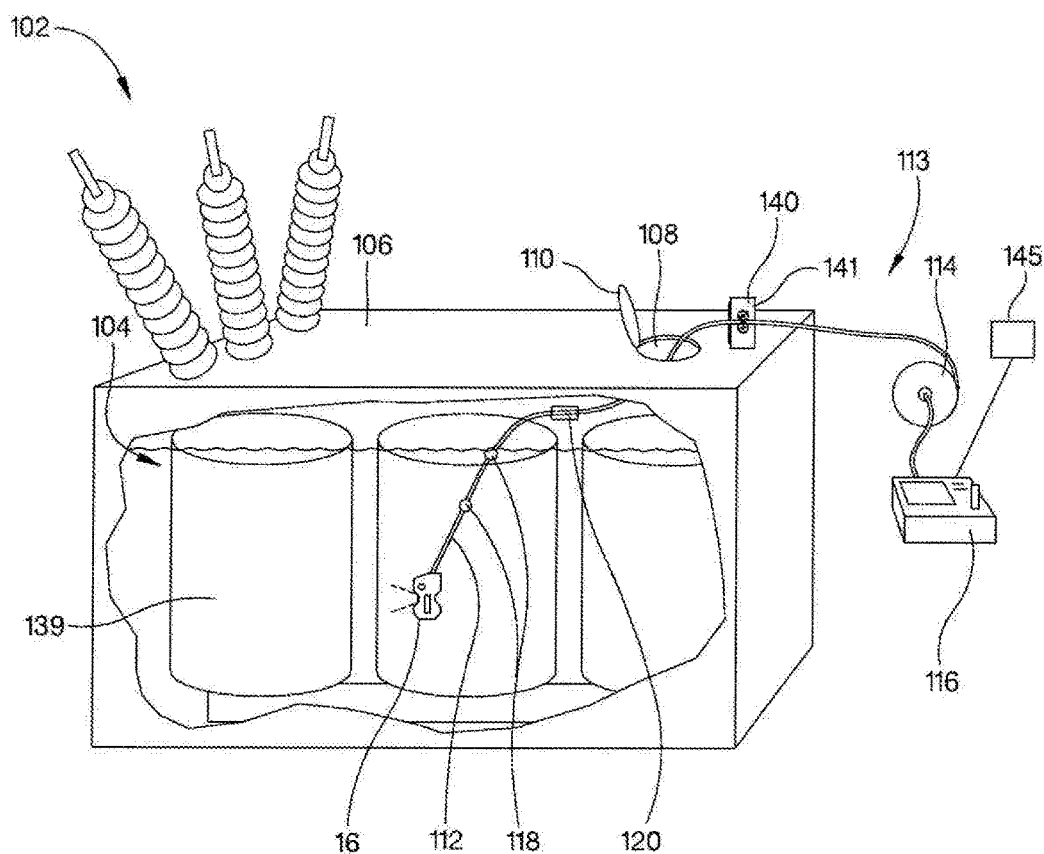
FIG. 10 is a perspective view of one embodiment of the inspection system as defined in the present application.

Referring now to FIG. 10, another embodiment of the present application is shown wherein a tank or housing 102 with internal components 139 can be inspected by an inspection vehicle 16. The housing 102 can include a cooling fluid 104 such as mineral oil or the like that at least partially fills an internal portion of the housing 102. The housing 102 can include a top wall 106 with an access port 108 formed therein. An enclosure 110, such as a lid or the like may be opened or closed as desired to permit or restrict access to internal regions of the housing 102. The inspection vehicle 16 can be attached to and controlled with a tether 112, when inserted through the access port 108 for operation in the housing 102. A tether system 113 can include a reel or spool 114 in some embodiments. A controller 116 can be connected to the tether 112, so as to provide electrical communication between the inspection vehicle 16 and the controller 116. The tether 112 can include one or more buoyant elements 118 and one or more floating bodies 120 operably connected thereto. The buoyant elements 118 and the floating bodies 120 provide position control of the tether 112 at various locations along a length thereof.

Figure 11:
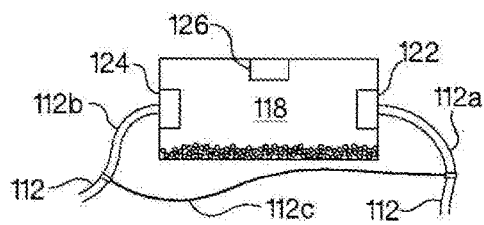
FIG. 11 is a schematic side view of a buoyant element having a plurality of valves to control a buoyancy level.

FIG. 11 illustrates a schematic view of a buoyant element 118, The tether 112 can include mechanical, electrical and pneumatic conduits and connections to provide operational control of the buoyant elements 118. The buoyant element 118 includes an inlet valve 122 and an outlet valve 124 connected to an inlet portion of the tether 112a and an outlet portion of the tether 112b, respectively. A discharge exchange valve 126 can be operably coupled to the buoyant element 118 so as to control a volume of gas and a volume of liquid within the buoyant element and thereby controlling the buoyancy or floating height of the buoyant element 118, The discharge exchange valve 126 can include multiple valve functions and passages so as to control the volume of gas and the volume of liquid within the buoyant element 118. The discharge exchange valve 126 can include two way liquid flow and/or gas flow such that the liquid and/or gas may pass between the buoyant element 118 and the housing 102 as required. The inlet valve 122 can permit a flow of gas conducted through a conduit associated with the tether 112 to enter the buoyant element 118 and the outlet valve 124 can permit a portion of the gas to egress through the outlet portion of the tether 112b such that the gas can be transmitted to another buoyant element 118 or to a floating body 120 downstream thereof. A flow of pressurized gas such as air or the like may be supplied by a compressor system 145 (see FIG. 10) as one skilled in the art would readily understand. A bypass portion 112c of the tether 112 can provide mechanical, electrical and pneumatic connections that bypass a buoyant element 118 and provide a direct connection to another buoyant element 118, to a floating body 120 or to the inspection vehicle 16. It should be understood that the valve system with valves 122, 124 and 126 are exemplary in nature and that other valving, gas flow and liquid control may be used and are contemplated under the teachings of the present disclosure.

Figure 12:
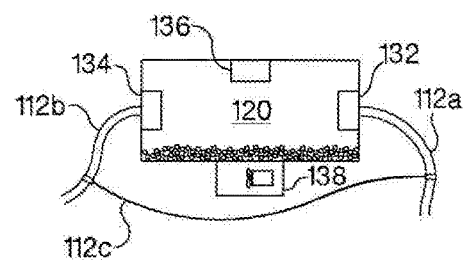
FIG. 12 is a schematic view of a floating body having a plurality of valves for controlling a buoyancy level and a propulsion system for controlling a position of the floating body.

FIG. 12 illustrates a schematic view of a floating body 120. In one form the floating body 120 may be permanently sealed without valves or variable buoyancy capability such that the floating body remains floating at the top of the liquid medium. In another form, the floating body 120 can have variable buoyancy capabilities. In this form, the floating body 120 can include an inlet valve 132 connected to an inlet portion 112a of the tether 112 and outlet valve 134 connected to an outlet portion 112b. A discharge exchange valve 136 is operable for controlling an amount of gas and liquid within the floating body 120. A bypass portion 112c of the tether 112 can provide mechanical, electrical and pneumatic connections that bypass the floating body 120 and provide a direction connection to another floating body 120, to a buoyant element 118 or to the inspection vehicle 16. The operation of the floating body 120 can be similar to the operation of the buoyant element 118. However the floating body 120 also includes a propulsion system 138 that permits directional control of the floating body 120. The propulsion system 138 can include a propeller or a fluid pump or the like, and can be rotatably connected to the floating body 120 so as to control directional movement thereof. The propulsion system 138 is operable for propelling the floating body 120 in a desired direction so as to maneuver the tether 112 around certain components within the housing 102 such as a component 139 illustrated in FIG. 10. In one form the component 139 can be an electrical component such as a coil for a transformer or the like. However, other components are contemplated herein.

Figure 13:
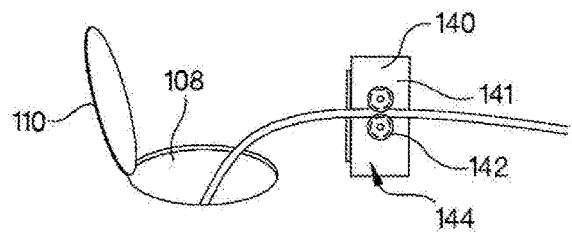
FIG. 13 is an enlarged view of a tether support and cleaning device attached to a housing proximate an access port.

Referring to FIG. 13, a tether control support 140 can be coupled to the housing 102 during an inspection or maintenance operation of the inspection vehicle 16. The control support 140 is operable to push or pull the tether 112 into or out of the housing 102. In some forms the control support 140 can include a cleaning device 141 as part of a single device. In other forms the control support 140 can be separate from the cleaning device 141. The tether cleaning device 141 can include sponge or brush type wipers 142 operable to clean a portion of the fluid 104 from the tether 112 as the tether 112 is retracted from the housing 102. The oil can drain back into the tank or housing 102 in a manner known to those skilled in the art. The tether cleaning device 140 can also include a detergent tank 144 so as to further clean and remove fluid from the tether 112 prior to rewinding on the reel or spool 114 or otherwise storing for future use. In one form the tether may be pulled through a detergent bath, in other forms a detergent solution may be sprayed onto the tether 112 through a nozzle as one skilled in the art would understand.

In one aspect the present disclosure includes an inspection system comprising: an inspection vehicle having a propulsion device operable in a liquid medium; at least one sensor operably coupled with the inspection vehicle; a control system including an electronic controller operably coupled with the inspection vehicle; a tether connected to the inspection vehicle; and a controllable buoyancy system operably coupled to the tether and the control system.

In refining aspects the controllable buoyancy system includes one or more floating bodies and buoyant elements connected to the tether; a gas conduit and an electrical conduit associated with the tether being connected to the one or more floating bodies and buoyant elements; wherein at least one of the floating bodies and the buoyant elements further comprise an inlet valve connected to the tether configured to ingress a flow of gas and/or liquid; an outlet valve connected to the tether configured to egress a flow of gas and/or liquid; a discharge exchange valve in fluid communication with the liquid medium in the housing configured to control a volume of gas and a volume of liquid within the floating bodies and the buoyant elements; a gas pump operably connected to the gas conduit wherein the controller transmits control commands to the gas pump and to the valves to define a buoyancy level of the floating bodies and the buoyancy elements such that the buoyancy level of the floating bodies and the buoyancy elements can be changed individually or together; wherein one or more floating bodies include a floating body propulsion system operable to generate directionally controlled thrust to the floating body in the liquid medium such that the floating bodies can be controlled individually or together; wherein a reel connected to the tether, the reel being operable to deploy and retract the tether into/from the liquid medium; the reel includes at least one of manual control means and an electrically controlled means; wherein a tether cleaning device operable to remove a portion of the liquid medium from the tether during retraction; wherein the tether cleaning device includes a sponge or brush wiper; wherein the tether cleaning device includes a detergent cleaning device; and a remote control station operable to transmit and receive vehicle control signals through the tether.

In another aspect the present disclosure includes an a method for inspecting components within a housing at least partially filled with a liquid, the method comprising: connecting a tether to an inspection vehicle; deploying the inspection vehicle into the housing; moving the inspection vehicle within the housing with a liquid drive propulsion device; sensing a portion of the components with a sensor operably coupled to the inspection vehicle; and controlling movement of the tether with a controllable buoyancy system.

In refining aspects the controllable buoyancy system includes one or more floating bodies connected to the tether; adjusting a volume of gas and a volume of liquid within the one or more floating bodies to control a buoyancy level; adjusting includes controlling gas flow with one or more valves coupled to the one or more floating bodies; maneuvering the one or more floating bodies by way of a floating body propulsion system operable within the liquid; automatically controlling a location of a floating body based on a predetermined control algorithm; wherein the controllable buoyancy system includes one or more buoyant elements connected to the tether; controlling a buoyancy level of each of the one or more buoyant elements individually or together; deploying and retracting the tether from/onto a reel; wherein the deploying and retracting includes at least one of manual control means and an electrical control means cleaning the tether with a tether cleaning device; wherein the cleaning includes removing liquid from the tether with a sponge or a wiper coupled to the cleaning device; wherein the cleaning includes applying a detergent solution to the tether; controlling the tether buoyancy system and the inspection vehicle via a remote control station.

In another aspect the present disclosure includes a tether system for a liquid propelled inspection vehicle comprising: a tether configured to connect a control system to the inspection vehicle; a controllable buoyancy system operably coupled to the tether.

In refining aspects the controllable buoyancy system includes one or more floating bodies connected to the tether; wherein the one or more floating bodies include a floating body propulsion system operable to maneuver the one or more floating bodies within the liquid medium; wherein the controllable buoyancy system includes a gas conduit associated with the tether and connected to the one or more floating bodies; wherein the controllable buoyancy system includes a gas pump operably connected to the gas conduit, wherein the controller transmits commands to the gas pump to deliver gas to the one or more floating bodies; a control system operable to control a buoyancy level and a position of the one or more floating bodies; wherein at least one of the floating bodies and the buoyant elements include at least one of an inlet valve, an outlet valve, and a discharge exchange valve operable for controlling a gas volume and a liquid volume internal to the at least one floating body and the at least one buoyant element either individually or together.

While the application has been illustrated and described in detail in the drawings and foregoing description, the same is to be considered as illustrative and not restrictive in character, it being understood that only the preferred embodiments have been shown and described and that all changes and modifications that come within the spirit of the applications are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the application, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. An inspection system comprising:
   an submersible inspection vehicle having a propulsion device operable in a liquid medium;
   at least one sensor operably coupled with the submersible inspection vehicle;
   a control system including an electronic controller operably coupled with the submersible inspection vehicle;
   a tether connected to the submersible inspection vehicle; and
   a controllable buoyancy system operably coupled to the tether and the control system;
   the controllable buoyancy system comprising one or more floating bodies and one or more buoyant elements connected to the tether; and
   the one or more floating bodies and the one or more buoyant elements being configured to adjust a volume of gas and a volume of liquid within the one or more floating bodies and the one or more buoyant elements, thereby controlling a buoyancy level and a floating height of the one or more floating bodies and the one or more buoyant elements.

2. The inspection system of claim 1, further comprising a gas conduit and an electrical conduit associated with the tether being connected to the one or more floating bodies and the one or more buoyant elements.

3. The inspection system of claim 2, wherein at least one of the one or more floating bodies and the one or more buoyant elements further comprise:
   an inlet valve connected to the tether configured to ingress a flow of gas and/or liquid;
   an outlet valve connected to the tether configured to egress a flow of gas and/or liquid; and
   a discharge exchange valve in fluid communication with the liquid medium in a housing configured to control a volume of gas and a volume of liquid within the one or more floating bodies and the one or more buoyant elements.

4. The inspection system of claim 3, further comprising a gas pump operably connected to the gas conduit, and wherein the electronic controller transmits control commands to the gas pump and to the valves to define the buoyancy level of the one or more floating bodies and the one or more buoyancy elements such that the buoyancy level of the one or more floating bodies and the one or more buoyancy elements can be changed individually or together.

5. The inspection system of claim 1, wherein the one or more floating bodies include a floating body propulsion system operable to generate directionally controlled thrust to the floating body in the liquid medium such that the one or more floating bodies can be controlled individually or together.

6. The inspection system of claim 1, further comprising a reel connected to the tether, the reel being operable to deploy and retract the tether into/from the liquid medium.

7. The inspection system of claim 6, wherein the reel includes at least one of manual control means and an electrically controlled means.

8. The inspection system of claim 1, further comprising a tether cleaning device operable to remove a portion of the liquid medium from the tether during retraction.

9. The inspection system of claim 8, wherein the tether cleaning device includes a sponge or brush wiper.

10. The inspection system of claim 8, wherein the tether cleaning device includes a detergent cleaning device.

11. The inspection system of claim 1, further comprising a remote control station operable to transmit and receive vehicle control signals through the tether.

12. A method for inspecting components within a housing at least partially filled with a liquid medium, the method comprising:
   connecting a tether to an submersible inspection vehicle;
   deploying the submersible inspection vehicle into the housing;
   moving the submersible inspection vehicle within the housing with a liquid drive propulsion device;
   sensing a portion of the components with a sensor operably coupled to the submersible inspection vehicle; and
   controlling movement of the tether with a controllable buoyancy system, the controllable buoyancy system comprising one or more floating bodies and one or more buoyant elements connected to the tether; and
   adjusting a volume of gas and a volume of liquid within the one or more floating bodies and the one or more buoyant elements by the one or more floating bodies and the one or more buoyant elements, thereby controlling a buoyancy level and a floating height of the one or more floating bodies and the one or more buoyant elements.

13. The method of claim 12, wherein the adjusting includes controlling gas flow with one or more valves coupled to the one or more floating bodies.

14. The method of claim 12, further comprising maneuvering the one or more floating bodies by way of a floating body propulsion system operable within the liquid medium.

15. The method of claim 12, further comprising automatically controlling a location of a floating body based on a predetermined control algorithm.

16. The method of claim 12 further comprising controlling the buoyancy level of each of the one or more buoyant elements individually or together.

17. The method of claim 12, further comprising deploying and retracting the tether from/onto a reel.

18. The method of claim 17, wherein the deploying and retracting includes at least one of manual control means and an electrical control means.

19. The method of claim 12, further comprising cleaning the tether with a tether cleaning device.

20. The method of claim 19, wherein the cleaning includes removing liquid from the tether with a sponge or a wiper coupled to the cleaning device.

21. The method of claim 19, wherein the cleaning includes applying a detergent solution to the tether.

22. The method of claim 12, further comprising controlling the tether buoyancy system and the submersible inspection vehicle via a remote control station.

23. A tether system for a liquid propelled submersible inspection vehicle comprising:
   a tether configured to connect a control system to the submersible inspection vehicle;
   a controllable buoyancy system operably coupled to the tether;
   the controllable buoyancy system comprising one or more floating bodies and one or more buoyant elements connected to the tether; and
   the one or more floating bodies and the one or more buoyant elements being configured to adjust a volume of gas and a volume of liquid within the one or more floating bodies and the one or more buoyant elements, thereby controlling a buoyancy level and a floating height of the one or more floating bodies and the one or more buoyant elements.

24. The system of claim 23, wherein the one or more floating bodies include a floating body propulsion system operable to maneuver the one or more floating bodies within the liquid medium.

25. The system of claim 23, wherein the controllable buoyancy system includes a gas conduit associated with the tether and connected to the one or more floating bodies.

26. The system of claim 25, wherein the controllable buoyancy system includes a gas pump operably connected to the gas conduit, wherein a controller transmits commands to the gas pump to deliver gas to the one or more floating bodies.

27. The system of claim 23, further comprising a control system operable to control the buoyancy level and a position of the one or more floating bodies.

28. The system of claim 23, wherein at least one of the one or more floating bodies and the one or more buoyant elements include at least one of an inlet valve, an outlet valve, and a discharge exchange valve operable for controlling a gas volume and a liquid volume internal to the at least one floating body and the at least one buoyant element either individually or together.

* * * * *